United States Patent
Dhindsa

(10) Patent No.: US 7,572,737 B1
(45) Date of Patent: Aug. 11, 2009

(54) APPARATUS AND METHODS FOR ADJUSTING AN EDGE RING POTENTIAL SUBSTRATE PROCESSING

(75) Inventor: Rajinder Dhindsa, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 458 days.

(21) Appl. No.: 11/428,155

(22) Filed: Jun. 30, 2006

(51) Int. Cl.
*H01L 21/302* (2006.01)

(52) U.S. Cl. .......................... 438/714; 216/68; 156/345

(58) Field of Classification Search ................ 438/706, 438/712, 714, 729; 216/58, 67, 68, 69, 70; 156/345

See application file for complete search history.

(56) References Cited

U.S. PATENT DOCUMENTS

| | | | |
|---|---|---|---|
| 6,635,185 B2 * | 10/2003 | Demmin et al. ............... 216/64 |
| 2003/0019582 A1 * | 1/2003 | Drewery ................ 156/345.43 |
| 2003/0164142 A1 * | 9/2003 | Koshimizu .................. 118/409 |
| 2004/0053428 A1 * | 3/2004 | Steger .......................... 438/10 |
| 2005/0230049 A1 * | 10/2005 | Nishio et al. ............ 156/345.51 |
| 2006/0042754 A1 | 3/2006 | Yoshida et al. |
| 2006/0060303 A1 | 3/2006 | Fink et al. |
| 2006/0066247 A1 * | 3/2006 | Koshiishi et al. ........ 315/111.21 |
| 2006/0118044 A1 | 6/2006 | Himori et al. |
| 2007/0066062 A1 * | 3/2007 | Liu et al. ..................... 438/689 |
| 2007/0193688 A1 * | 8/2007 | Dhindsa et al. ......... 156/345.43 |
| 2008/0241420 A1 * | 10/2008 | Dhindsa et al. ............. 427/569 |

OTHER PUBLICATIONS

"Written Opinion", Issue in PCT Application No. PCT/US2007/72157; Mailing Date.: Feb. 28, 2008.
"International Search Report", Issue in PCT Application No. PCT/US2007/72157; Mailing Date.: Feb. 28, 2008.
"International Preliminary Report on Patentability", Issued in PCT Application No. PCT/US2007/072157; Mailing Date: Jan. 15, 2009.

* cited by examiner

*Primary Examiner*—Kin-Chan Chen
(74) *Attorney, Agent, or Firm*—IP Strategy Group, P.C.

(57) ABSTRACT

A method for processing a substrate in a plasma processing chamber. The substrate is disposed above a chuck and surrounded by an edge ring while the edge ring being electrically isolated from the chuck. The method includes providing RF power to the chuck and providing a edge ring DC voltage control arrangement. The edge ring DC voltage control arrangement is coupled to the edge ring to provide first voltage to the edge ring, with the edge ring potential being one of a positive potential, a negative potential and a ground. The method further includes generating a plasma within the plasma processing chamber to process the substrate. The substrate is processed while the edge ring DC voltage control arrangement is configured to cause the edge ring potential to be less than a DC potential of the substrate in an embodiment and to be substantially equal to the DC potential of the substrate in another embodiment.

30 Claims, 4 Drawing Sheets

APPARATUS AND METHODS FOR ADJUSTING AN EDGE RING POTENTIAL SUBSTRATE PROCESSING

BACKGROUND OF THE INVENTION

The present invention relates in general to substrate manufacturing technologies and in particular to an apparatus for ion incident angle control and/or for polymer control and methods therefor.

In the processing of a substrate, e.g., a semiconductor substrate or a glass panel such as one used in flat panel display manufacturing, plasma is often employed. As part of the processing of a substrate for example, the substrate is divided into a plurality of dies, or rectangular areas, each of which will become an integrated circuit. The substrate is then processed in a series of steps in which materials are selectively removed (etching) and deposited. Control of the transistor gate critical dimension (CD) on the order of a few nanometers is a top priority, as each nanometer deviation from the target gate length may translate directly into the operational speed of these devices.

Areas of the hardened emulsion are then selectively removed, causing components of the underlying layer to become exposed. The substrate is then placed in a plasma processing chamber on a substrate support structure comprising a mono-polar or bi-polar electrode, called a chuck or pedestal. Appropriate etchant gases are then flowed into the chamber and struck to form a plasma to etch exposed areas of the substrate.

A common etching method is RIE or reactive ion etch. RIE combines both chemical and ion processes in order to remove material from the substrate (e.g., photoresist, BARC, TiN, Oxide, etc.). However, the pressure to further reduce substrate feature sizes, as well as the implementation of newer optimized substrate materials, has challenged current fabrication technologies. For example, it is becoming increasing difficult to maintain the uniformity or process results from the center to the edge of larger substrates (e.g., >300 mm). In general, for a given feature size, the larger the size of the substrate, the greater the number of devices on the substrate near the edge. Likewise, for a given substrate size, the smaller the feature size, the greater the number of devices on the substrate near the edge. For example, often over 20% the total number of devices on a substrate is located near the perimeter the substrate.

Due to substrate edge effects, such as electric field, plasma temperature, and the loading effects from process chemistry, the process results near the substrate edge may differ from the remaining (center) area of the substrate. For example, the equipotential lines of the plasma sheath may become disrupted, causing non-uniform ion angular distribution around the substrate edge.

Referring now to FIG. 1, a simplified diagram of a capacitively coupled plasma processing system is shown. In general, a source RF generated by source RF generator 110 is commonly used to generate the plasma as well as control the plasma density via capacitively coupling. In other configurations, multiple RF generators may be used.

Generally, an appropriate set of gases is flowed through an inlet in upper electrode 102, and subsequently ionized to form a plasma 104, in order to process (e.g., etch or deposit) exposed areas of substrate 106, such as a semiconductor substrate or a glass pane, positioned with an edge ring 112 (e.g., Si, etc.) on an electrostatic chuck 108, which also serves as a powered electrode. Certain etch applications may require the upper electrode to be grounded with respect to a lower electrode frequency RF signal within ~20 KHz thru 800 KHz. Other etch applications may require the upper electrode to be grounded with respect to a lower electrode RF signal that is at least one of 2 MHz, 27 MHz, and 60 MHz. Still other etch application may require the upper electrode to be grounded with respect to all of the RF signal frequencies previously mentioned.

Edge ring 112 generally performs many functions, including positioning substrate 106 on chuck 108 and shielding the underlying components not protected by the substrate itself from being damaged by the ions of the plasma edge ring 112 may further sit on coupling ring 120 (e.g., quartz, etc.), which is generally configured to provide a current path from chuck 108 to an edge ring 112.

In general, it is desirable for the electric field to remain substantially constant over the entire surface of the substrate in order to maintain process uniformity and vertical etch profiles. However, because of plasma chamber conditions and/or configuration, a potential difference may exist between chuck 108 and the edge ring 112. Consequently, this potential difference may create a non-uniformity 122 in the plasma sheath shape, and hence adversely affect the etch profile.

In addition, during the etch process, it is not uncommon for polymer byproducts (e.g., fluorinated polymers, etc.) to form on the substrate backside and/or around the substrate edge. Fluorinated polymers generally comprise photoresist material previously exposed to an etch chemistry, or polymer byproducts deposited during a fluorocarbon etch process. In general, a fluorinated polymer is a substance with a chemical equation of $C_xH_yF_z$, where x, z are integers greater than 0, and y is an integer greater than or equal to 0 (e.g., $CF_4$, $C_2F_6$, $CH_2F_2$, $C_4F_8$, $C_5F_8$, etc.).

However, as successive polymer layers are deposited on the edge area as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield.

Referring now to FIG. 2, a simplified diagram of a substrate in which a set of edge polymers have been deposited on the planar backside is shown. As previously stated, during the etch process, it is not uncommon for polymer byproducts (edge polymers) to form on the substrate. In this example, the polymer byproducts have been deposited on the planar backside, that is, the side of the substrate away from the plasma. For example, the polymer thickness may be about 250 nm at about 70° 202, 270 nm at about 45° 204, and about 120 nm at 0° 206. In general, the greater the thickness of the polymer, the higher the likeliness that a portion of the polymer may become dislodged and fall onto another substrate or the chuck, potentially affecting manufacturing yield.

SUMMARY OF THE INVENTION

The invention relates, in an embodiment, to a method for processing a substrate in a plasma processing chamber. The substrate is disposed above a chuck and surrounded by an edge ring while the edge ring being electrically isolated from the chuck. The method includes providing RF power to the chuck and providing a edge ring DC voltage control arrangement. The edge ring DC voltage control arrangement is coupled to the edge ring to provide first voltage to the edge ring, resulting in the edge ring having an edge ring potential relative to the DC potential of the substrate. The method further includes generating a plasma within the plasma processing chamber to process the substrate. The substrate is processed while the edge ring DC voltage control arrangement is configured to cause the edge ring potential to be greater than the DC potential of the substrate in an embodiment, to be substantially equal to the DC potential of the substrate in another embodiment, or to be less than the DC potential of the substrate in yet another embodiment to control the ion directionality at the substrate edge.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

Figure 1:
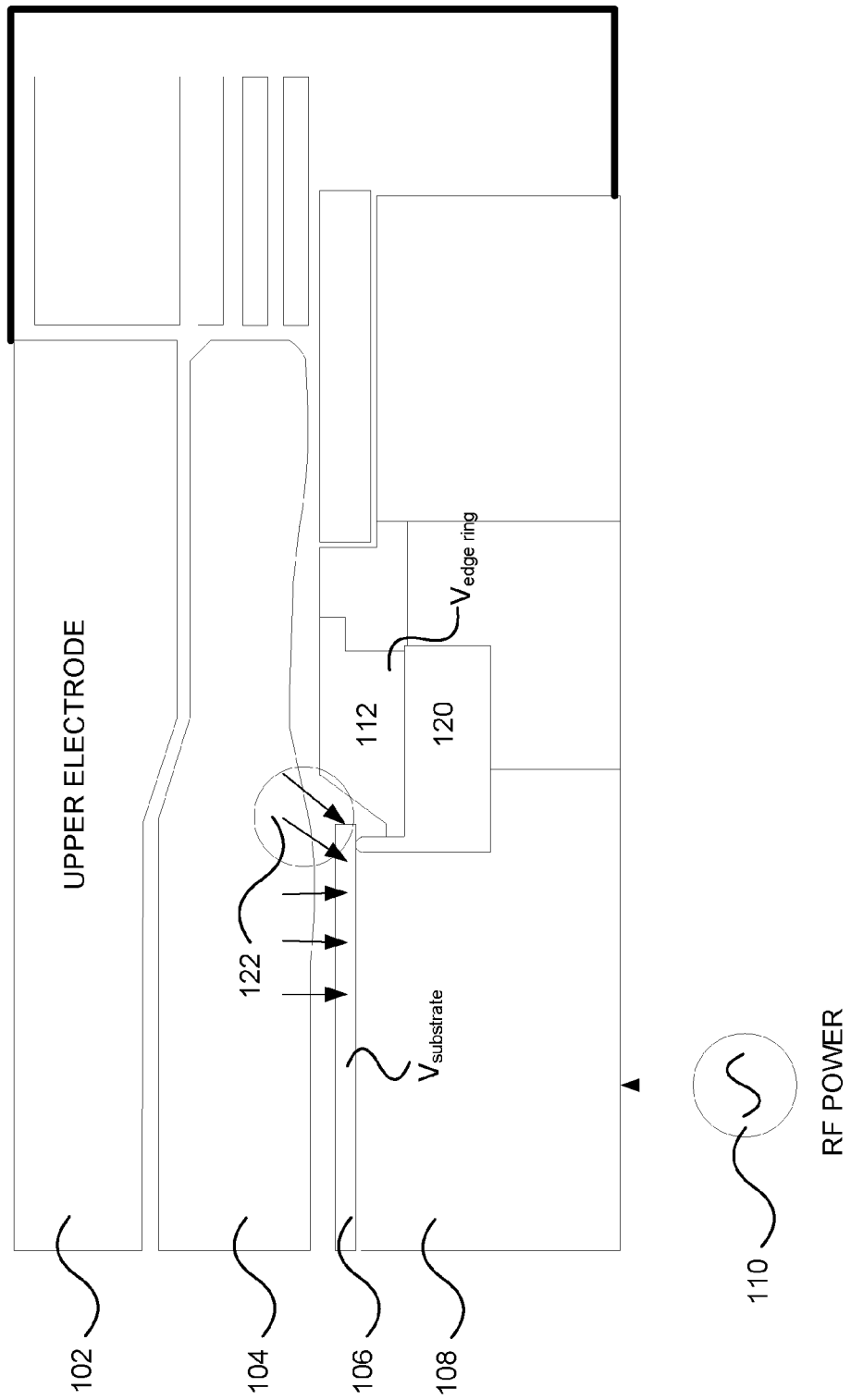
FIG. 1 shows a simplified diagram of a capacitively coupled plasma processing system.
Figure 2:
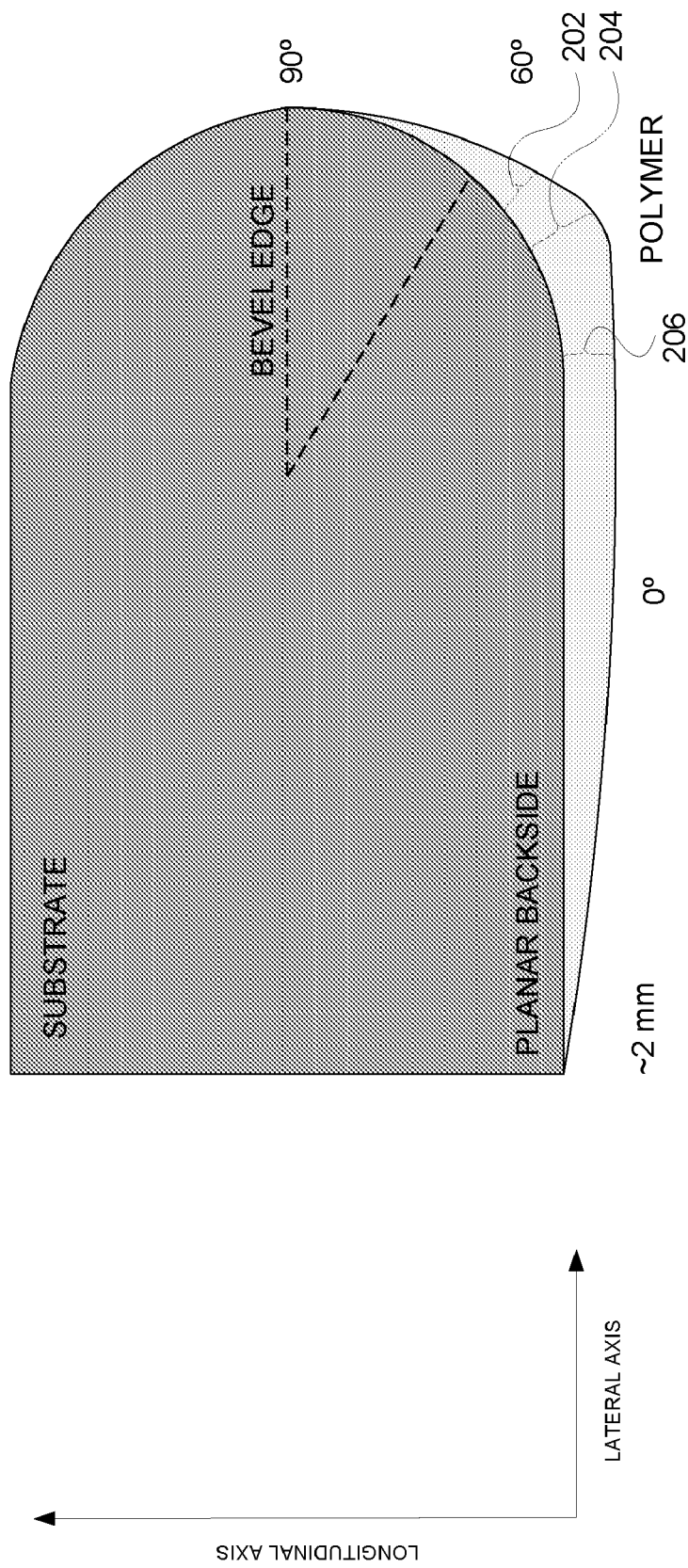
FIG. 2 shows a simplified diagram of a substrate in which a set of edge polymers have been deposited on the planar backside.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

While not wishing to be bound by theory, the inventor believes that the ion angular distribution may be controlled by altering the DC potential between the substrate and the edge ring, thus optimizing the equipotential lines of the plasma sheath for a given plasma process. In an advantageous manner, changes may be made to the electric field around the substrate edge by changing an RF coupling of an edge ring. In an embodiment, the chuck is substantially electrically isolated from the edge ring.

For example, if the DC potential of the substrate edge is substantially the same as the DC potential of the edge ring, the ion angular distribution is generally uniform. Consequently, in an area of the plasma sheath above both the substrate and the edge ring, a set of ion vectors are formed that are substantially perpendicular to the substrate.

However, if the DC potential of the substrate edge is substantially different to the DC potential of the edge ring, the ion angular distribution is generally non-uniform. Consequently, in an area of the plasma sheath above both the substrate and the edge ring, a set of ion vectors are formed that tend to point either toward or away from the substrate.

In an advantageous fashion, the DC potential on the edge ring may be independently controlled from that of the substrate. Consequently, the difference between the DC potential of the substrate to the DC potential of the edge ring may be optimized in order to control the angular distribution of the positively charged ions in the plasma around the edge of the substrate.

For example, if the DC voltage of the edge ring is negative and substantially similar to that of the substrate (e.g., $V_{substrate} - V_{edge\ ring} \approx 0$), angular ion distribution is substantially uniform, with a set of vectors that are substantially perpendicular to the substrate, in an area of the plasma sheath above both the substrate and the edge ring. This angular profile may be useful for anisotropic etch applications, such as etching contacts and trenches with high aspect ratios.

In addition, certain devices require the etch features (e.g., high aspect ratio contacts, vias or trenches) to assume a particular directionality in order to, for example, enable a particular etch feature to make contact with another underlying feature. For example, if a vertical via etch is required to allow the via to make contact with an underlying feature, a deviation from etch verticality may cause the via to miss the intended underlying feature, thereby resulting in a defective device and affecting yield. For these applications, precise control of ion directionality at the substrate edge to achieve proper etch directionality is a critical requirement.

In contrast, if the DC voltage of the edge ring is more positive (less negative) than that of the substrate (e.g., $V_{substrate} - V_{edge\ ring} < 0$), the angular ion distribution profile is substantially non-uniform, with a set of vectors that tend to point toward the substrate edge. This angular profile may be useful for edge polymer removal. Unlike wet cleaning processes, the current invention allows edge polymer removal in an all-dry (e.g., process, etc.) with minimal effluent across a wide variety of vacuum-compatible materials (e.g., silicon, metals, glass, ceramics, etc.). For example, a common dry etch process involves ion-assisted etching, or sputtering, in which ions are used to dislodge material from the substrate (e.g., oxide, etc.). Generally ions in the plasma enhance a chemical process by striking the surface of the substrate, and subsequently breaking the chemical bonds of the atoms on the surface in order to make them more susceptible to reacting with the molecules of the chemical process.

Figure 3A:
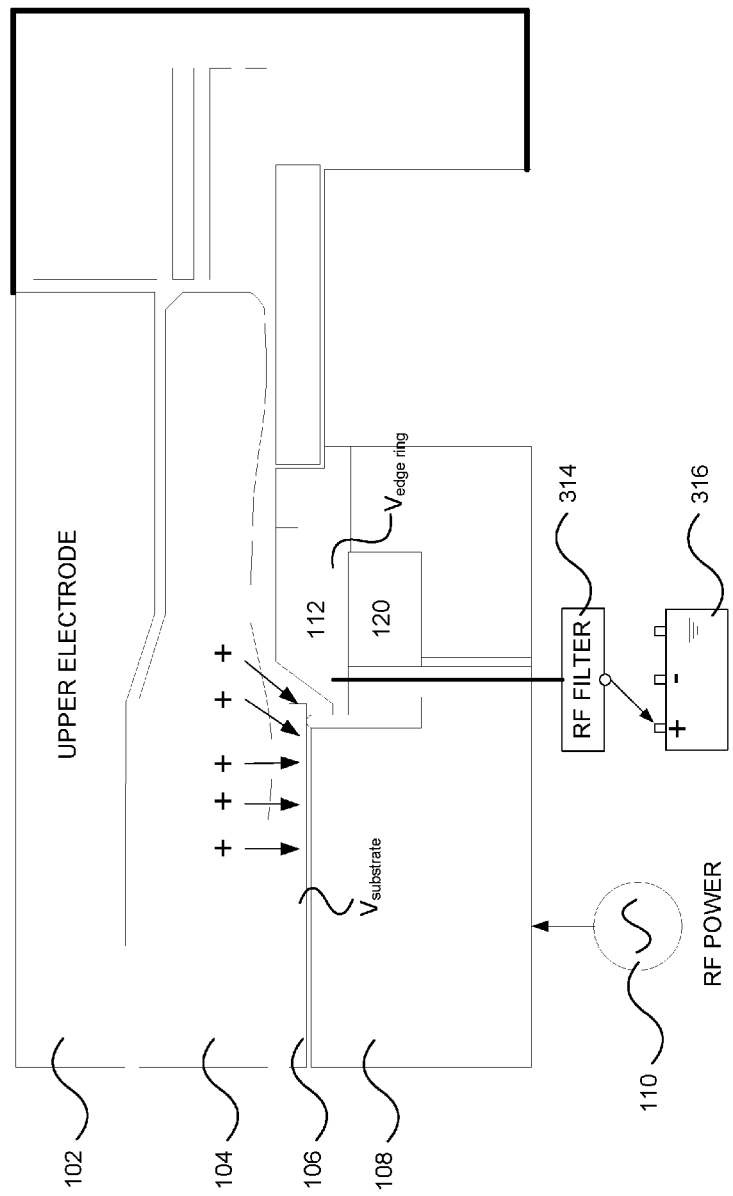
FIGS. 3A-B show a set of simplified diagrams showing a capacitively coupled plasma processing system with optimized ion angular distribution, according to an embodiment of the invention.
Figure 3B:
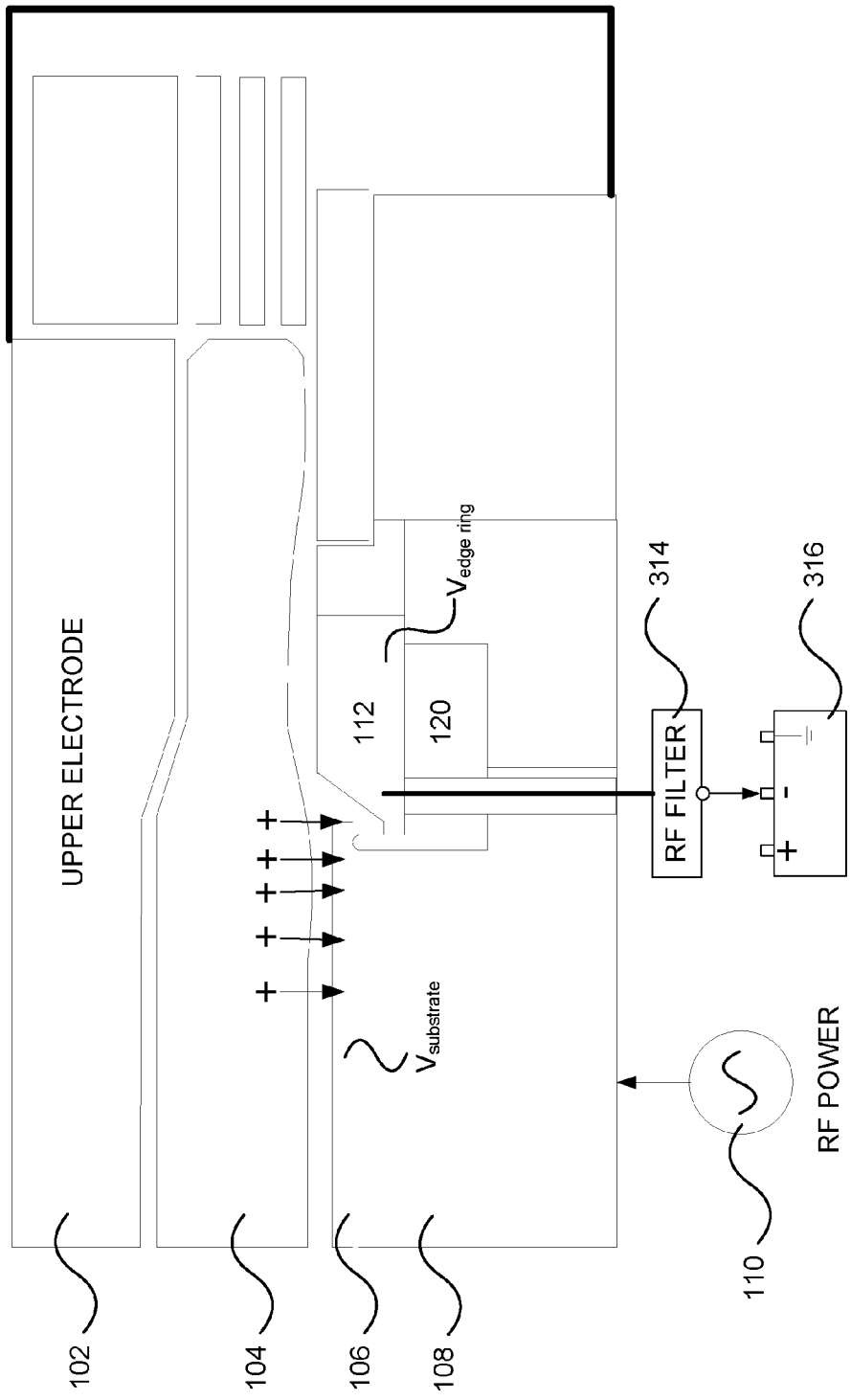

Referring now to FIGS. 3A-B, a set of simplified diagrams showing a capacitively coupled plasma processing system with optimized ion angular distribution is shown, according to an embodiment of the invention. FIG. 3A shows a simplified diagram of a capacitively coupled plasma processing system in which the DC potential of the edge ring is substantially greater than that of the substrate. In general, a source RF generated by source RF generator 110 is commonly used to generate the plasma as well as control the plasma density via capacitively coupling. As previously mentioned, certain etch applications may require the upper electrode to be grounded with respect to a lower electrode frequency RF signal within ~20 KHz thru 800 KHz. Other etch applications may require the upper electrode to be grounded with respect to an RF signal that is at least one of 2 MHz, 27 MHz, and 60 MHz. Still other etch applications may require the upper electrode to be grounded with respect to all of the RF signal frequencies previously mentioned.

Generally, an appropriate set of gases is flowed through an inlet in upper electrode 102, and subsequently ionized to form a plasma 104, in order to process (e.g., etch or deposit) exposed areas of substrate 106, such as a semiconductor substrate or a glass pane, positioned with an edge ring 112 (e.g., Si, etc.) on an electrostatic chuck 108, which also serves as a powered electrode.

Edge ring 112 generally performs many functions, including positioning substrate 106 on chuck 108 and shielding the underlying components not protected by the substrate itself from being damaged by the ions of the plasma edge ring 112 may further sit on coupling ring 120 (e.g., quartz, etc.), which is generally configured to provide a current path from chuck 108 to an edge ring 112. In general, in an advantageous manner, a configurable DC power source 316 may be coupled to edge ring 112 through RF filter 314.

RF filter 314 is generally used to provide attenuation of unwanted harmonic RF energy without introducing losses to DC power source 316. In an embodiment, RF filter 314 includes a switch module that allows a positive or negative current polarity to be selected, as well as a path to ground. In an embodiment, the RF filter 314 includes vacuum relays. Harmonics are generated in the plasma discharge and may be kept from being returned to the DC power source by the RF filter. In this case, since DC power source 316 sources a positive voltage, the DC potential of the edge ring is substantially higher than that of the substrate in a typical plasma process. Thus, the angular ion distribution profile is thus substantially non-uniform, with a set of vectors that tend to point toward areas of lower potential, such as the substrate edge. This application is highly useful for polymer removal from the substrate edge, as mentioned earlier.

Referring now to FIG. 3B, a simplified diagram is shown of a capacitively coupled plasma processing system in which the DC potential of the edge ring is substantially similar to that of the substrate (e.g., $V_{substrate} - V_{edge\ ring} \approx 0$). Generally speaking, the DC potential on the substrate during processing tends to be negative with respect to ground, and thus when the edge ring is coupled to receive a negative potential (with respect to ground), the DC potential of the edge ring and the DC potential of the substrate are substantially equal. Consequently, angular ion distribution is substantially uniform, with a set of vectors that are substantially perpendicular to the substrate in an area of the plasma sheath above both the substrate and the edge ring. As previously stated, this perpendicular angular profile may be useful for anisotropic etch applications, such as etching contacts and trenches with high aspect ratios.

It is also possible to, for example, couple the ground terminal of the DC power source, in which case the edge ring may have a higher potential (being at ground) than the DC potential of the substrate (being generally negative during processing, in an embodiment). In this case, the angular ion distribution will also tend toward the substrate edge, albeit to a lesser degree than when the edge ring is coupled to receive voltage from the positive terminal of the DC power source (as in the case of FIG. 3A).

In an embodiment, a feedback circuit may be provided to monitor the DC voltage of the substrate (which may vary during the various process steps and process substeps). The monitored DC voltage of the substrate may be employed as a feedback signal in an appropriate control circuit to control the DC voltage delivered to the edge ring, thereby allowing the appropriate ion directionality to be maintained even if the DC voltage of the substrate changes.

In an embodiment, the DC voltage of the edge ring may be provided by a RF power source (e.g., a RF power source that may be different from the RF power source delivering RF power to the lower electrode). Thus, DC voltage control of the edge ring relative to the DC potential of the substrate is the thrust of the techniques of various embodiments disclosed herein, and the actual edge ring DC voltage control arrangement to provide/maintain the DC voltage to the edge ring may differ depending on implementations.

While this invention has been described in terms of several preferred embodiments, there are alterations, permutations, and equivalents, which fall within the scope of this invention. It should also be noted that there are many alternative ways of implementing the methods and apparatuses of the present invention. Although various examples are provided herein, it is intended that these examples be illustrative and not limiting with respect to the invention. Further, the abstract is provided herein for convenience and should not be employed to construe or limit the overall invention, which is expressed in the claims. It is therefore intended that the following appended claims be interpreted as including all such alterations, permutations, and equivalents as fall within the true spirit and scope of the present invention. For example, although the present invention has been described in connection with Lam Research plasma processing systems (e.g., Exelan™, Exelan™ HP, Exelan™ HPT, 2300™, Versys™ Star, etc.), other plasma processing systems may be used (e.g., capacitively coupled, inductively coupled, etc.). This invention may also be used with substrates of various diameters (e.g., 200 mm, 300 mm, LCD, etc.). Furthermore, the term set as used herein includes one or more of the named element of the set. For example, a set of "X" refers to one or more "X."

Advantages of the invention include substantial control of ion angular distribution around the substrate edge. Additional advantages include cleaning a bevel polymer during an in situ strip process, optimizing the plasma process, and improving substrate yield.

Having disclosed exemplary embodiments and the best mode, modifications and variations may be made to the disclosed embodiments while remaining within the subject and spirit of the invention as defined by the following claims.

What is claimed is:

1. A method for processing a substrate in a plasma processing chamber, said substrate being disposed above a chuck and surrounded by an edge ring, said edge ring being electrically isolated from said chuck, said method comprising:
   providing RF power to said chuck;
   coupling an edge ring DC voltage control arrangement to said edge ring to provide first voltage to said edge ring, resulting in said edge ring having an edge ring potential;
   generating a plasma within said plasma processing chamber to process said substrate; and
   adjusting said edge ring DC voltage control arrangement to cause said plasma to have a non-uniform angular ion distribution profile for processing an edge of said substrate, wherein said adjusting causes said edge ring potential to be higher than a DC potential of said substrate.

2. The method of claim 1 wherein said edge ring DC voltage control arrangement includes an RF filter arrangement and a DC power source, said RF filter arrangement being disposed between said edge ring and said DC power source.

3. The method of claim 2 wherein said RF filter arrangement is configured to attenuate unwanted harmonic RF energy from reaching said DC power source.

4. The method of claim 1 wherein said RF power has an RF frequency in a range from about 20 KHz to about 800 KHz.

5. The method of claim 1 wherein said RF power has a set of RF frequencies that includes at least one of 2 MHz, 27 MHz, and 60 MHz.

6. The method of claim 1 wherein said plasma processing chamber represents a capacitively coupled plasma processing chamber.

7. The method of claim 1 wherein said plasma processing chamber represents an inductively coupled plasma processing chamber.

8. The method of claim 1 wherein said edge ring DC voltage control arrangement includes an RF power supply.

9. The method of claim 1 wherein said edge ring DC voltage control arrangement includes an DC power supply.

10. The method of claim 1 further including a feedback circuit configured to monitor said DC potential of said substrate, whereby said DC potential of said substrate is employed as a feedback signal to vary said first voltage when said DC potential of said substrate changes.

11. A method for reducing polymer deposition around an edge of a substrate in a plasma processing chamber, said substrate being disposed above a chuck and surrounded by an edge ring, said edge ring being electrically isolated from said chuck, said method comprising:
providing RF power to said chuck;
using an edge ring DC voltage control arrangement to provide first voltage to said edge ring, resulting in said edge ring having an edge ring potential;
generating a plasma within said plasma processing chamber to process said substrate; and
adjusting said edge ring DC voltage control arrangement to cause said edge ring potential to be different from a DC potential of said substrate while processing said substrate so as to cause an ion incident angle of ions disposed in a vicinity of said edge of said substrate to be biased toward said edge of said substrate and away from said edge ring, wherein said adjusting causes said plasma to have a non-uniform angular ion distribution profile.

12. The method of claim 11 wherein said edge ring DC voltage control arrangement includes an RF filter arrangement and a DC power source, said RF filter arrangement being disposed between said edge ring and said DC power source.

13. The method of claim 12 wherein said RF filter arrangement is configured to attenuate unwanted harmonic RF energy.

14. The method of claim 11 wherein said plasma processing chamber represents a capacitively coupled plasma processing chamber.

15. The method of claim 11 wherein said RF power has an RF frequency in a range from about 20 KHz to about 800 KHz.

16. The method of claim 11 wherein said RF power has a set of RF frequencies that includes at least one of 2 MHz, 27 MHz, and 60 MHz.

17. The method of claim 11 wherein said plasma processing chamber represents an inductively coupled plasma processing chamber.

18. The method of claim 11 wherein said edge ring DC voltage control arrangement includes an RF power supply.

19. The method of claim 11 wherein said edge ring DC voltage control arrangement includes an DC power supply.

20. The method of claim 11 further including a feedback circuit configured to monitor said DC potential of said substrate, whereby said DC potential of said substrate is employed as a feedback signal to vary said first voltage when said DC potential of said substrate changes.

21. A method for processing a substrate in a plasma processing chamber, said substrate being disposed above a chuck and surrounded by an edge ring, said edge ring being electrically isolated from said chuck, said method comprising:
providing RF power to said chuck;
using an edge ring DC voltage control arrangement to provide first voltage to said edge ring, resulting in said edge ring having an edge ring potential;
generating a plasma within said plasma processing chamber to process said substrate; and adjusting said edge ring DC voltage control arrangement to cause said plasma to have a non-uniform angular ion distribution profile, wherein said adjusting causes said edge ring potential to be less than a DC potential of said substrate while processing said substrate.

22. The method of claim 21 wherein said edge ring DC voltage control arrangement includes an RF filter arrangement and a DC power source, said RF filter arrangement being disposed between said edge ring and said DC power source.

23. The method of claim 22 wherein said RF filter arrangement is configured to attenuate unwanted harmonic RF energy.

24. The method of claim 21 wherein said RF power has an RF frequency in a range from about 20 KHz to about 800 KHz.

25. The method of claim 21 wherein said RF power has a set of RF frequencies that includes at least one of 2 MHz, 27 MHz, and 60 MHz.

26. The method of claim 21 wherein said plasma processing chamber represents a capacitively coupled plasma processing chamber.

27. The method of claim 21 wherein said plasma processing chamber represents an inductively coupled plasma processing chamber.

28. The method of claim 21 wherein said edge ring DC voltage control arrangement includes an RF power supply.

29. The method of claim 21 wherein said edge ring DC voltage control arrangement includes an DC power supply.

30. The method of claim 21 further including a feedback circuit configured to monitor said DC potential of said substrate, whereby said DC potential of said substrate is employed as a feedback signal to vary said first voltage when said DC potential of said substrate changes.

* * * * *